United States Patent [19]

Hayashi

[11] 4,145,652

[45] Mar. 20, 1979

[54] ELECTRIC POWER TO DC SIGNAL CONVERTER

[75] Inventor: Eiji Hayashi, Tokyo, Japan

[73] Assignee: Kabushikikaishi Yokogawa Denki Seisakusho, Tokyo, Japan

[21] Appl. No.: 843,504

[22] Filed: Oct. 19, 1977

[30] Foreign Application Priority Data

Nov. 12, 1976 [JP] Japan .................................. 51-136056

[51] Int. Cl.² .............................................. G01R 21/06
[52] U.S. Cl. ..................................................... 324/142
[58] Field of Search ..................... 324/142; 235/151.21, 235/151.31

[56] References Cited

U.S. PATENT DOCUMENTS

| Re. 29,079 | 12/1976 | Gilbert | 324/142 |
|---|---|---|---|
| 3,818,340 | 6/1974 | Yamaguchi | 324/142 |
| 3,953,795 | 4/1976 | Brunner et al. | 324/142 |
| 3,955,138 | 5/1976 | Milkovic | 324/142 X |
| 3,976,942 | 8/1976 | Mayfield | 324/142 |
| 4,055,803 | 10/1977 | Kraley et al. | 324/142 |

FOREIGN PATENT DOCUMENTS

472677 6/1969 Switzerland .............................. 324/142

*Primary Examiner*—Stanley T. Krawczewicz
*Attorney, Agent, or Firm*—Moonray Kojima

[57] ABSTRACT

An apparatus for measuring power in a power circuit, comprising a pulse width modulator comprising an integrator, a comparator having hysteresis characteristic and connected to the output side of the integrator, and a feedback circuit for feeding the output of the comparator back to the input side of the integrator; and an analog switch. The voltage of the power circuit is applied to the input of the integrator of the modulator so as to be pulse width modulated. The current of the power circuit is applied to the analog switch. The output of the modulator is applied to the analog switch to turn on and off the analog switch and thereby multiply the voltage and current. The apparatus is comprised of electronic circuit and may be fabricated by integrated circuit techniques. Advantageously, the invention eliminates the necessity of using separate movable coils for measuring the power.

9 Claims, 6 Drawing Figures

ELECTRIC POWER TO DC SIGNAL CONVERTER

BACKGROUND OF THE INVENTION

1. Field of Invention

The present invention relates to an electric power to d-c signal converter which receives a voltage and a current of an a-c circuit and, after multiplying the voltage by current, produces an output d-c signal proportional to the input electric power of the a-c circuit.

2. Description of the Prior Art

In the prior art, there are a variety of apparatus for measuring electric power in a power circuit. The best known is the eletrodynamic type wattmeter using a stationary coil and a movable coil as multiplying elements. In such a wattmeter, the current of an a-c circuit is applied to the stationary coil while the voltage thereof is applied to the movable coil through a high resistance, and the force resulting from the electromagnetic interaction between the two coils is utilized to obtain the electric power of the power circuit. However, disadvantageously, the electrodynamic type wattmeter is complex in structure due to the necessity of having a stationary coil and a movable coil and hence requires intricate assembly and adjustment. Moreover, such prior art wattmeters are not too accurate. Furthermore, in a three-phase wattmeter equipped with a movable mechanism wherein two movalbe coils are attached to a movable shaft, there is another disadvantage in that it is impossible to use the component parts of a single-phase wattmeter directly in a three-phase wattmeter.

SUMMARY OF THE INVENTION

The present invention has been accomplished in an attempt to eliminate the above-described disadvantages of the prior art.

An object of the invention is to provide an improved electric power to d-c signal converter wherein assembly and adjustment are facilitated by employing pulse width modulator, which functions as a multiplier, in an electronic circuit configuration.

Another object is a wattmeter composed entirely of electronic circuits without employing any of such movable or stationary coil as a multiplying element.

A further object of the invention is to provide a compact, light weight and low-cost electric power to d-c signal converter offering high accuracy and adapted for use with integrated circuit techniques.

Another object of the invention is to provide an improved converter which can easily convert three phase electric power, three-phase reactive power or three-phase, four-wire power to a d-c signal by employing two pulse width modulators of the same composition as that of a device used for conversion of single-phase power to a d-c signal.

Another object is to provide an improved electric power to d-c signal converter having a protective means against input impulses.

A still further object is to provide an improved converter which is suitable for a number of power ratings.

The foregoing and other objects of the invention are attained in an apparatus comprising a pulse width modulator comprising an integrator having an input means connectable for application of voltage from a circuit whose power is to be measured and an output means, a comparator having hysteresis characteristic and input means and output means, the input means being connected to said output means of the integrator, and a feedback circuit connected between the output means of the comparator and the input means of the integrator; an analog switch having input means connectable for application of current from the measured circuit and an output means; a scaling amplifier connected to the analog switch; and a meter for indicating a d-c signal proportional to the power of the measured circuit. The output means of the pulse width modulator is connected to the analog switch for application of output signal from the pulse width modulator to the analog switch thereby to intermittently turn on and off the analog switch and thereby multiply the voltage by the current. The output signal of the analog switch is then applied via the scaling amplifier to the meter. In this manner, the power of the circuit is easily measured without the use of one or more moving coils, and advantageously with use of only electronic components which are readily fabricated using integrated circuit techniques. Substantial savings in material, assembling, and adjustment are attained.

A plurality of protective circuits comprising a pair of oppositely disposed parallel diodes are connected to various components such as the integrator, scaling amplifier, etc, to protect the apparatus from damage resulting from input impulses.

A plurality of similar circuits can be combined, for example, as discussed hereinbelow, to enable measurement of three phase power, three phase reactive power, or three phase four-wire power. Thus, advantageously, the integrated circuit technology can be employed to produce very inexpensively, wattmeters for measurement of not only single phase power, but the other three phase powers as just noted.

Advantageously, and in a manner which substantially advances the art, the inventor hereof has discovered a power to dc signal converter which departs from the prior art use of one or more moving coils, which are inefficient, bulky, expensive and inaccurate. In contrast, the instant invention can be fabricated and adjusted very inexpensively, is versatile in that similar circuit components and elements can be combined to cover a wide range of types of power sources and wide range of values, and furthermore is highly accurate since measurement does not depend upon moving parts, and the resultant friction.

A feature of the invention is a power to d-c signal converter, wherein voltage is applied to a pulse width modulator, and current is applied to an analog switch, and wherein the output signal from the pulse width modulator is applied to the analog switch to intermittently turn same on and off, thereby multiplying the voltage and current.

Another feature of the invention is a power to d-c signal converter composed entirely of electronic circuitry and more preferably using integrated circuit techniques for fabrication and without use of any moving parts for the multiplication of voltage and current.

A further feature of the invention is a converter which converts power of a measured circuit to a d-c signal, wherein the voltage of the measured circuit is applied to an integrator and then to a comparator, with feedback therebetween, and current of the measured circuit is applied suitably to an analog switch, and wherein the output signal from the comparator is applied to the analog switch which effectively multiplies the voltage and current of the measured circuit.

Another feature of the invention is the use of a plurality of protective circuits comprising a pair of oppositely disposed parallel diodes to protect against input impulses.

Another feature is the use of a plurality of similar circuit components, such as integrator, comparator, etc, to measure three phase power, three phase reactive power and three phase, four wire power.

A further feature of the invention is use of a scaling amplifier connected to the output of the analog switch to control the range of values of power to be measured by the apparatus.

The foregoing features, objects, and advantages of the invention are discussed in further detail hereinbelow.

DETAILED DESCRIPTION OF PREFERRED EMBODIMENTS

Figure 1:
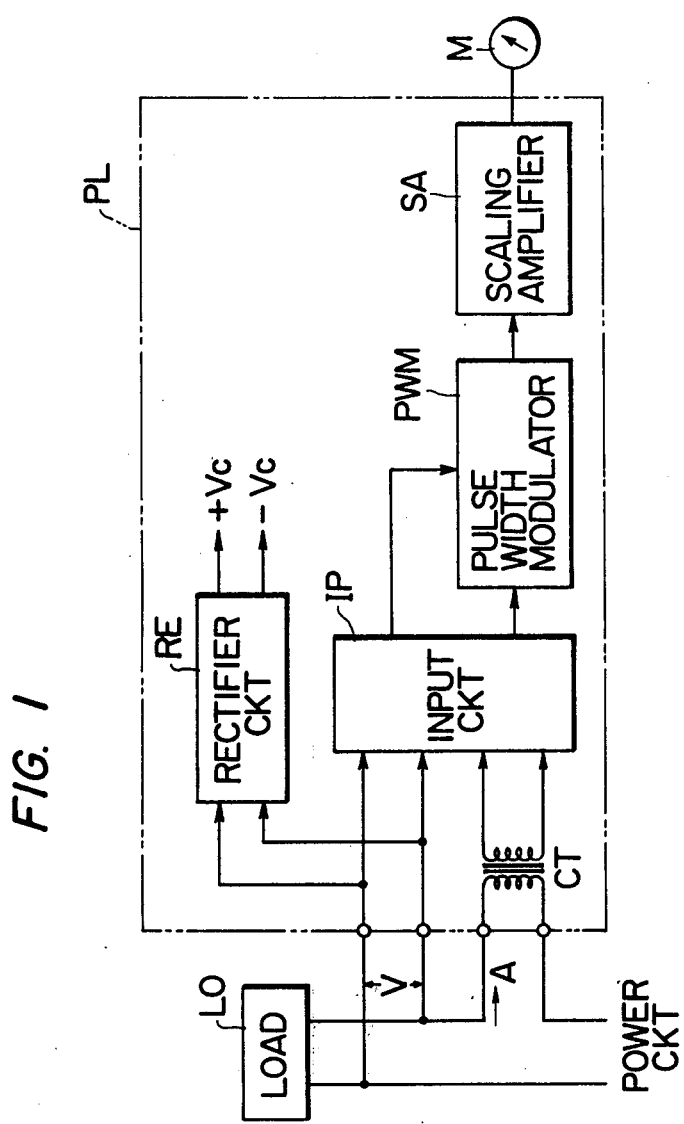
FIG. 1 depicts a block diagram illustrating the operating principles of the invention.

Turning now to the block diagram of FIG. 1, converter PL is connected to a power circuit for measuring the power of such circuit. It comprises an input circuit IP which receives a voltage V from a power circuit where load LO is connected, and also receives a current A from the power circuit through a current transformer CT; a pulse width modulator PWM serving as a multiplier; and a scaling amplifier SA. The output of converter PL is indicated by means of a meter M. Rectifier circuit RE receives and converts the input voltage V to a d-c voltage ±VC.

Figure 2:
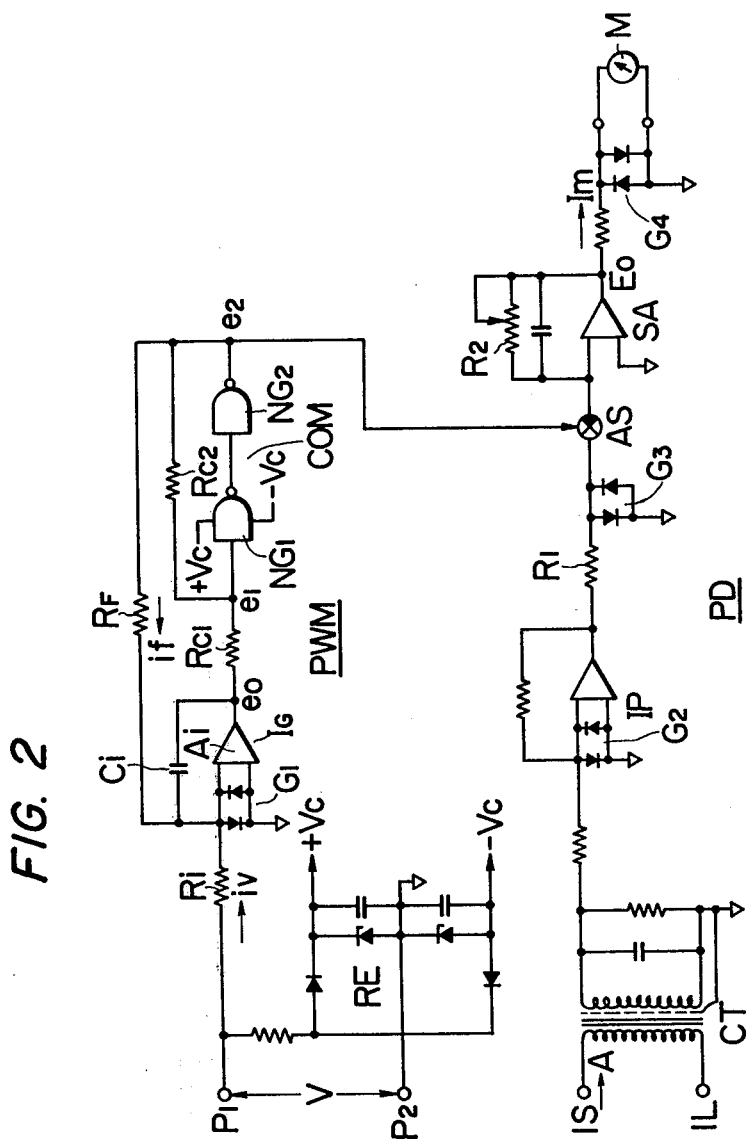
FIG. 2 depicts a detailed circuit diagram of an illustrative embodiment of the invention.

FIG. 2 depicts a more detailed circuit diagram of an illustrative embodiment of the invention, which embodiment converts a single phase electric power to a proportional d-c signal. In all of the FIGS. the same numeral and alphabetic designations are used for the same or similar components. Terminals P1 and P2 receive voltage V from the power circuit such as shown in FIG. 1. Terminals 1S and 1L receive current A from the power circuit. Rectifier circuit RE produces a voltage ±VC. This rectifier circuit RE may be equipped with a separate power transformer, and the voltage therefrom may be obtained therefrom. A pulse width modulator PWM comprises an integrator IG and a comparator COM. The integrator IG comprises an amplifier Ai, an input resistor Ri and a feedback capacitor Ci. The comparator COM comprises an input resistor RC1, a feedback resistor RC2, and NAND gates NG1, NG2 of C-MOS (complementary MOS). The d-c voltage ±VC obtained from the rectifier circuit RE is applied as a power source to the NANAD gate NG1. The comparator has hysteresis characteristic according to the action of feedback resistor RC2. The terminal P1 (which receives voltage V of the power circuit to be measured) is connected to the input resistor Ri of integrator IG, whose output terminal is connected to the input resistor RC1 of comparator COM. A feedback resistor RF is connected between the addition input terminal of integrator IG and the output terminal of comparator COM.

The primary winding of current transformer CT is connected to terminals 1S, 1L to which the current A of the power circuit is applied. The secondary winding of the current transformer CT is connected to the input terminal of the input circuit IP. The output terminal of the input circuit IP is connected to meter M, via resistor R1, analog switch AS and scaling amplifier SA, as depicted. Each of protection circuits G1, G2, G3, and G4 comprises a pair of diodes connected in parallel with each other in the opposite direction. Protection circuits G1 and G2 protect the input of each amplifier in the integrator IG and the input circuit IP, respectively, from an input impulse. Protection circuit G3 protects the analog switch AS from an input impulse. Protection circuit G4 protects the meter M. The analog switch AS is controlled by an output signal e2 of NAND gate NG2 in such a manner as to be turned on when e2 is "1" or to be turned off when e2 is "0".

Figure 3:
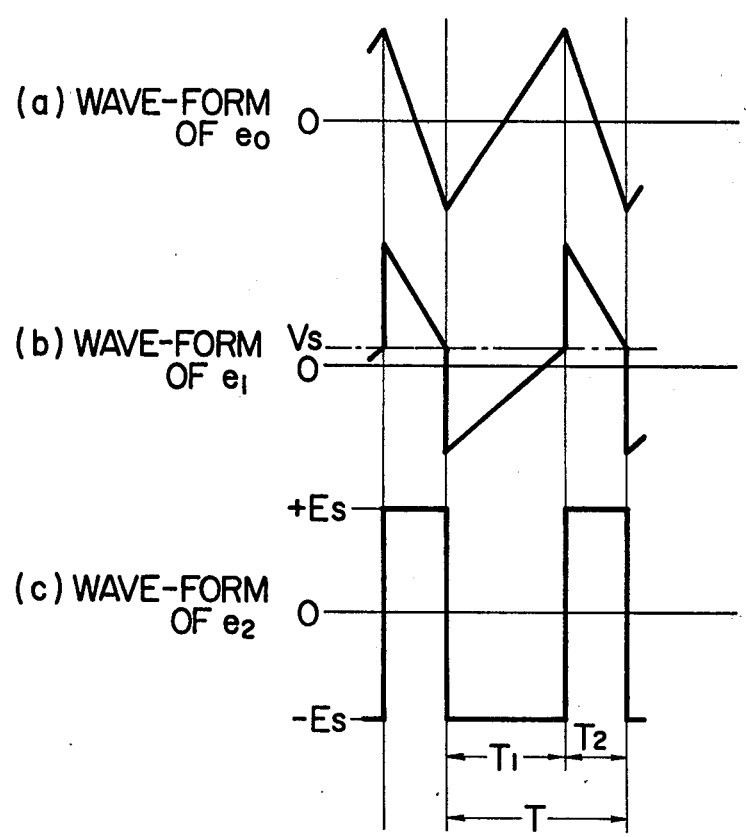
FIG. 3 is a waveform chart for explaining the operation of the embodiment of FIG. 2.

The embodiment of FIG. 2 operates in the following manner (see FIG. 3). Assuming that, as shown in FIG. 2, potentials e0, e1, e2 are present at the output terminals of integrator IG constituting the pulse width modulator PWM and at the input terminal of NAND gate NG1 and the output terminal of NG2 constituting the comparator COM, then the waveforms of e0, e1 and e2 are such as illustrated in FIGS. 3(a), 3(b) and 3(c), respectively. The potential e2 becomes a rectangular-wave voltage represented by ±Es as shown in FIG. 3(c). This voltage is fed back to the input terminal of integrator IG through a resistor RF. The integrator IG executes addition and integration of a current "iv" caused to flow in the resistor Ri by the voltage V to be measured and a current "± if" caused to flow in the feedback resistor RF by the feedback voltage ±Es. Since the values of the two currents are so selected as to satisfy the condition $|iv| < |if|$ to avoid overmodulation in the normal operating state, the output voltage e0 of integrator IG increases, during integration of "iv" and "−if" by the integrator IG, at a fixed angle of inclination as illustrated in the period T1 of FIG. 3(a). During the period T1, the voltage "e1" rises as shown in FIG. 3(b) at the angle of inclination determined by the ratio between the resistors RC1 and RC2. When the voltage reaches the threshold voltage Vs of NAND gate NG1, the output voltage e2 of NAND gate NG2 becomes a "1" level and then is fed back to the input terminal of NAND gate NG1 through the resistor RC2, thereby causing a sudden rise of "e1". The "1" level voltage "e2" or +Es is fed back through the resistor RF to the integrator IG, which executes addition and integration of the current "iv" and the current "+if" caused by the positive feedback voltage +Es. Accordingly as illustrated in the period T2 of FIG. 3(a), the output e0 of integrator IG falls at a certain angle of inclination sharper than that in the period T1.

As the output voltage e0 of integrator IG begins to advance in the negative direction, the voltage "e1" also decreases, and indicates a sudden drop immediately after arrival at Vs. Since the voltage e1 of the waveform shown in FIG. 3(b) is applied to the NAND gate NG1, the voltage e2 at the output terminal of NAND gate NG2 is shaped into a rectangular wave represented by ±Es, as shown in FIG. 3(c). Thus, the input terminal of integrator IG receives, during the period T1, the sum of the currents proportional respectively to the input voltage V and the feedback voltage −Es, and also receives, during the period T2, the sum of the currents proportional respectively to the input voltage V and the feedback voltage ±Es. That is, the integrator IG is so driven that the sum of the voltages applied thereto becomes zero.

Therefore, the following Equation (1) is established.

$$(V - Es)\frac{T1}{T1 + T2} + (V + Es)\frac{T2}{T1 + T2} = 0 \quad (1)$$

From Equation (1), $$V = Es\left(\frac{T1 - T2}{T1 + T2}\right) \quad (2)$$

In the above, $$\frac{T1 - T2}{T1 + T2}$$

is expressed as follows:

$$\frac{T1 - T2}{T1 + T2} = \frac{T1 + T2 - 2T2}{T1 + T2} = 1 - \frac{2T2}{T1 + T2} \quad (3)$$

Since the analog switch AS is of one-side switching type, $$\frac{T1 - T2}{T1 + T2}$$

becomes a half of equation (3) and is presented by the following:

$$\frac{T1 - T2}{T1 + T2} = \frac{1}{2}(1 - \frac{2T2}{T1 + T2}) = \frac{1}{2} - \frac{T2}{T1 + T2} \quad (4)$$

From Equations (2) and (4), $$\frac{T2}{T1 + T2} = \frac{1}{2} - \frac{V}{Es} \quad (5)$$

As is obvious from Equation (5), the width of the output pulse e2 of comparator COM is modulated in accordance with the input voltage V applied from the power circuit.

In the meanwhile, the current A of the power circuit applied to the terminals 1S and 1L is converted to a proper value by means of current transformer CT and then is applied to the analog switch AS through the input circuit IP. The analog switch AS is controlled by the output e2 of comparator COM constituting the pulse width modulator PWM, in such a manner as to be turned on during the period T2 or to be turned off during the period T1. Consequently, the current A applied to the input side of analog switch AS is connected or disconnected intermittently by the output signal e2 of pulsewidth modulator PWM. The envelope curve of the current "i" flowing into the scaling amplifier SA is proportional to the input current A, and the relation between them is represented by the following equation:

$$i = \frac{T2}{T1 + T2} \cdot A = (\frac{1}{2} - \frac{V}{Es}) \cdot A = \frac{1}{2}A - \frac{V \cdot A}{Es} \quad (6)$$

The mean value (d-c component) of Equation (6) is obtained from the output terminal of scaling amplifier SA. As the first term on the right side of Equation (6) denotes merely the a-c component, its mean value becomes zero. Accordingly, the output voltage $E_0$ of scaling amplifier Sa is expressed as $$E_0 \propto \frac{V \cdot A}{Es} \quad (7)$$

Since Es is constant in Equation (7), $E_0$ is the product of V and A, that is, the voltage corresponding to the electric power W in the power circuit. The voltage $E_0$ is fed in the form of current "Im" to the meter M, which indicates the value of the electric power W. The scaling amplifier SA performs scaling and amplification to set a rated electric power. The feedback resistor R2 of scaling amplifier SA is of the variable type, and scaling is effected by varying the value of resistor R2 to change the gain.

Thus, in the electric power to d-c signal converter of the present invention, integrated circuit configuration is applicable to the pulse-width modulator serving as a multiplier, thereby rendering it possible to attain a compact, lightweight and low-cost converter. In addition, various other advantages are attained. For example, no selector part is required, thus resulting in high accuracy. Also, the number of wiring and adjusting steps can be minimized. Moreover, there exists another advantage in that, by providing a scaling amplifier SA in the manner above disclosed, converters of various power ratings can be produced and standarized, through mere adjustment of the scaling resistor R2. Furthermore, the protective circuits enable stable operation by protecting the circuits against input impulses.

Figure 4:
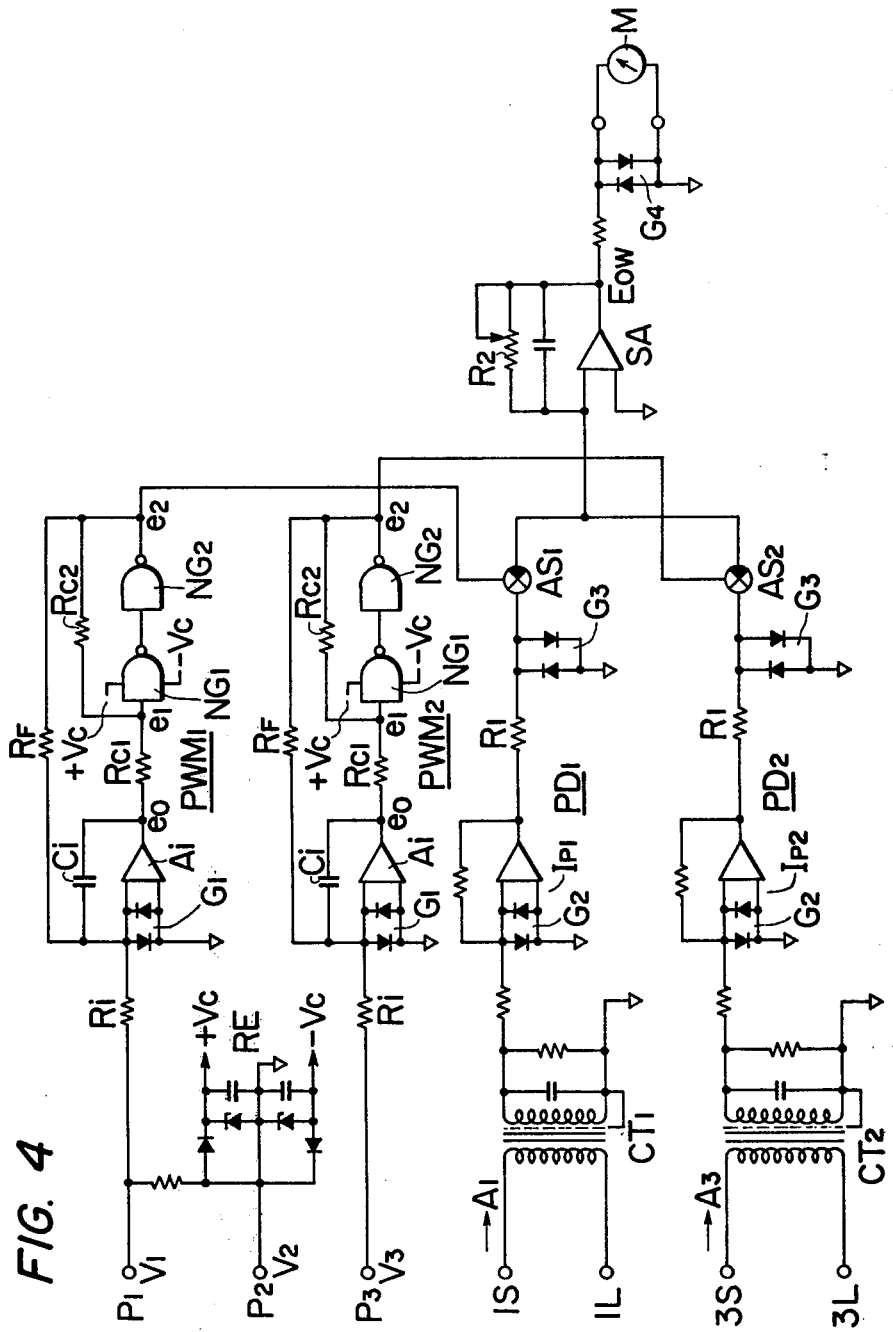
FIGS. 4, 5 and 6, depict circuit diagrams of other embodiments of the invention.

FIG. 4 is a circuit diagram showing an embodiment of a three phase three wire electric power to d-c signal converter. P1, P2, P3 are voltage terminals in a three phase power circuit. 1S, 1L, 3S, 3L are current terminals. PWM1, and PWM2 are pulse width modulators, each having the same composition as the modulator depicted in FIGS. 1 and 2, wherein the input terminal of PWM1 is connected to the voltage terminal P1 while the input terminal of PWM2 is connected to the voltage terminal P3. IP1 and IP2 are input circuits, in which the input terminal of IP1 is connected to the current terminals 1S, 1L through a current transformer CT1. The input terminal of IP2 is connected to the current terminals 3S, 3L through a current transformer CT2. AS1 and AS2 are analog switches, in which a current A1 is applied to AS1 from the current terminals 1S, 1L while a current A3 is applied to AS2 from the current terminals 3S, 3L. The analog switches AS1, AS3 are turned on or off intermittently by the outputs of pulsewidth modulators PWM1, and PWM2, individually. The voltage EOw produced as the result of addition of the electric powers shown in Equation (7), that is $$\frac{V1 \cdot A}{Es} + \frac{V3 \cdot A3}{Es},$$

is obtained from the output terminal of the scaling amplifier SA, and this voltage EOw corresponding to the three phase three wire electric power is indicated by means of a meter M.

Figure 5:
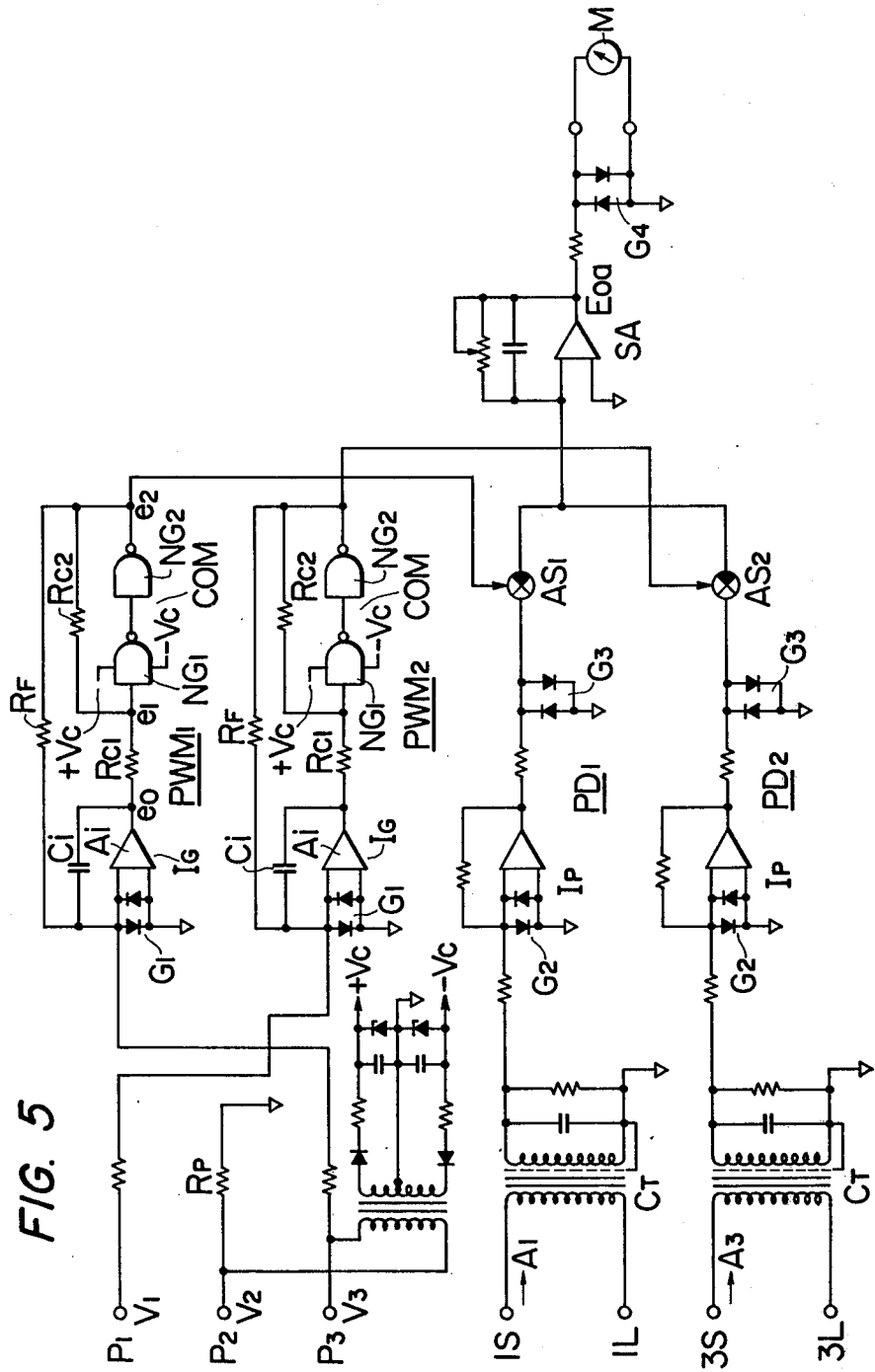

FIG. 5 depicts an embodiment of the invention which converts a three-phase wire reactive power to a proportional d-c signal. When a false neutral point is formed in this circuit by connecting a terminal P2 in common through a resistor RP, the result is V3 = V31 − V23, V = V12 − V31 so that V3 and V1 come to have a $\pi/2$ phase advance to V12 and V23 respectively at completely balanced voltages. Consequently, through multiplying V1 by the first phase current A1 in the power circuit and also multiplying V3 by third phase current A3, a d-c signal EOa corresponding to three phase three wire reactive power (VAR) is obtained from the output terminal of scaling amplifier SA. This d-c voltage is indicated by means of meter M. Multiplication of voltage by current is performed by pulse width modulators PWM1 and PWM2. Each of these modulators has the same composition and operating properties of the pulse width modulator PWM of FIG. 2.

Figure 6:
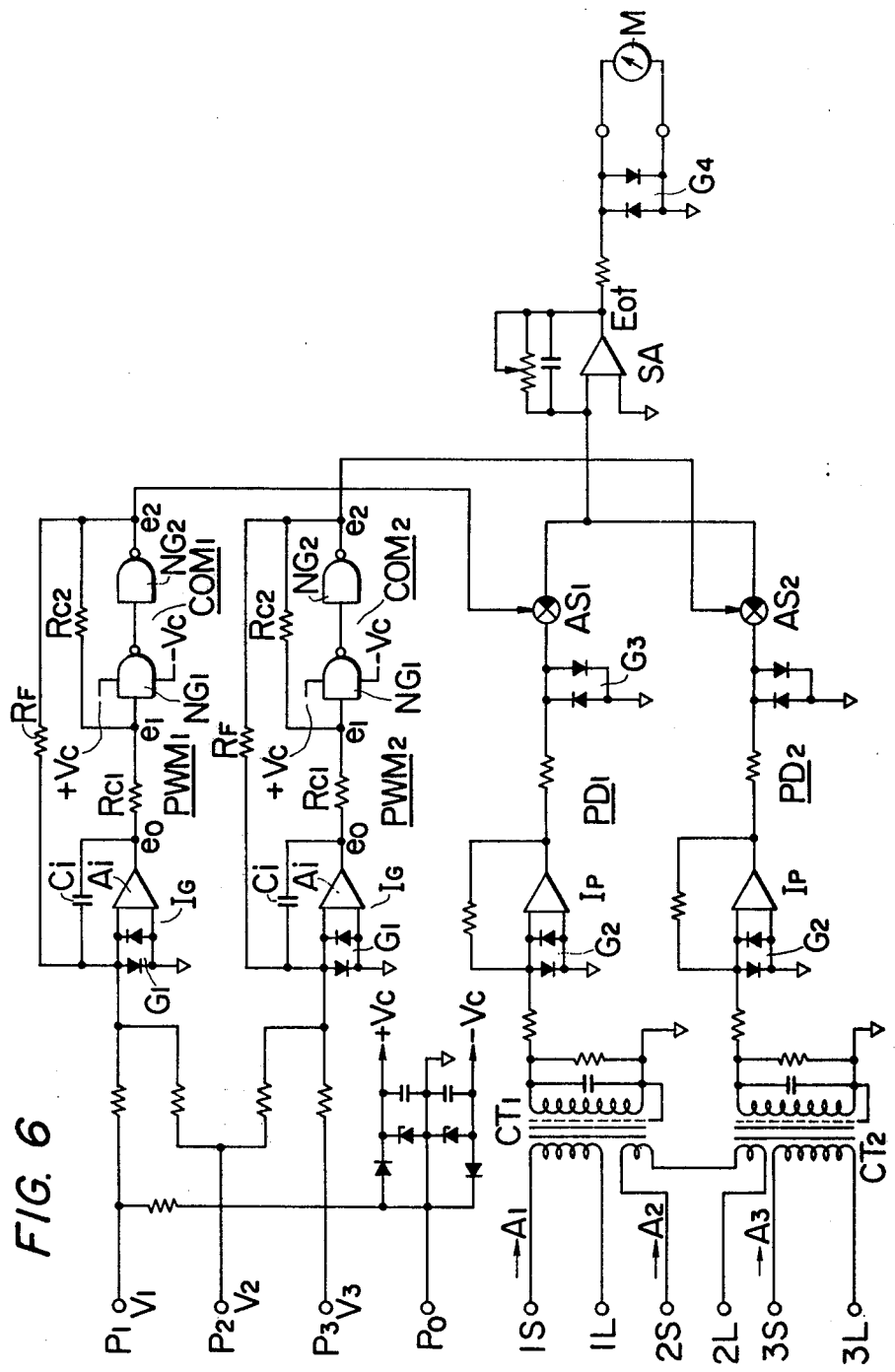

FIG. 6 depicts an embodiment relating to a three phase four wire wattmeter, in which Po is a neutral point. A pulse width modulator PWM1 receives voltages V1, V2 applied from terminals P1, P2. Modulator PWM2 receives voltages V2, V3 from terminals P2, P3. Pulse width modulator PWM1 multiplies the voltages V1, V2 by currents A1, A2 fed to current terminals 1S, 1L, 2S, 2L. The pulse width modulator PWM2 multiplies the voltages V2, V3 by currents A2, A3 fed to current terminals 2S, 2L, 3S, 3L. The results of such multiplications are averaged by the scaling amplifier SA, and its output voltage Eot is indicated by means of meter M. The principle of multiplication performed by each of the pulse width modulators PWM1 and PWM2 is similar to that described for the embodiment of FIG. 2.

The converters shown in FIGS. 4, 5 and 6 have the same effect of action as that mentioned in relation to the single phase electric power to d-c signal converter of FIG. 2, and are capable of converting three phase three wire power, three phase three wire reactive power and three phase four wire power to proportional d-c signal respectively.

The foregoing description is illustrative of the principles of the invention. Numerous other variations and modifications thereof would be apparent to the worker skilled in the art. All such modifications and variations are to be considered to be within the spirit and scope of the invention.

What is claimed is:

1. An electric power to d-c signal converter comprising:
    a pulse width modulator comprising
        an integrator having a d-c amplifier to which a voltage signal from a power circuit is applied through an input resistor, and a feedback capacitor;
        a comparator having hysteresis characteristic comprising a first NAND gate of C-MOS connected through a resistance element to the output terminal of said integrator, a second NAND gate of C-MOS connected in series to the first NAND gate, and a feedback resistor connected between the input terminal of the first NAND gate and the output terminal of the second NAND gate; and
        a feedback resistor connected between the input terminal of the d-c amplifier of said integrator and the output terminal of the second NAND gate of said comparator; and
        an analog switch driven by the output signal of said pulse width modulator for turning on and off the current signal from said power circuit; a smoothing circuit for smoothing the output of said analog switch; and a rectifier circuit for smoothing the voltage signal from said power circuit and rendering the signal a constant signal, and applying the constant voltage to the d-c amplifier constituting said pulse width modulator, and to the first and second NAND gates as a power voltage, whereby a d-c signal corresponding to the power of said power circuit is obtained from the output terminal of said smoothing circuit.

2. The converter of claim 1, wherein a moving coil type indicator is connected to said output terminal of said smoothing circuit.

3. The converter of claim 1, comprising two sets of said pulse width modulators and analog switches, wherein the voltage of a first line in a three-phase power circuit, of which second line is connected in common, is applied to the first pulse width modulator, while the voltage of a third line is applied to the second pulse width modulator; and the current flowing in the first line is applied to the first analog switch controlled to be on or off by the output signal of the first pulse width modulator, while the current flowing in the third line is applied to the second analog switch controlled to be on or off by the output signal of the second pulse width modulator; and the outputs of the first and second analog switches are added to each other and are smoothed to produce an output d-c signal.

4. The converter of claim 1, comprising two sets of said pulse width modulators and analog switches, wherein the voltage of a first line in a three phase power circuit, of which second line is connected in common through a resistor, is applied to the first pulse width modulator, while the voltage of a third line is applied to the second pulse width modulator; and the current flowing in the third line is applied to the first analog switch controlled to be on or off by the output signal of the first pulse width modulator, while the current flowing in the first line is applied to the second analog switch controlled to be on or off by the output signal of the second pulse width modulator; and the outputs of the first and second analog switches are added to each other and are smoothed to produce an output d-c signal.

5. The converter of claim 1, comprising two sets of said pulse width modulators and analog switches, wherein the voltages of first and second lines in a three phase four wire power circuit with a neutral point are applied to the first pulse width modulator, while the voltage of second and thrid lines are applied to the second pulse width modulator; and the currents flowing in the first and second lines are applied to the first analog switch controlled to be on or off by the output signal of the first pulse width modulator, while the currents flowing in the second and third lines are applied to the second analog switch controlled to be on or off by the output signal of the second pulse width modulator; and the outputs of the first and second analog switches are added to each other and are smoothed to produce an output d-c signal.

6. The converter of claim 1, further comprising means for smoothing the output of said analog switch, comprising a scaling amplifier in which a variable resistor is connected between the input and output thereof.

7. The converter of claim 3, further comprising a scaling amplifier having a variable resistor connected between the input and output thereof, for smoothing the output of said analog switch.

8. The converter of claim 4, further comprising a scaling amplifier having a variable resistor connected between the input and output thereof, for smoothing the output of said analog switch.

9. The converter of claim 5, further comprising a scaling amplifier having a variable resistor connected between the input and output thereof, for smoothing the output of said analog switch.

* * * * *